(12) United States Patent
Bennett et al.

(10) Patent No.: US 11,393,325 B2
(45) Date of Patent: Jul. 19, 2022

(54) POWER CONTROL CIRCUIT

(71) Applicant: Tyco Fire & Security GmbH, Neuhausen am Rheinfall (CH)

(72) Inventors: Steven Ian Bennett, Sunbury (GB); Paul W. Cottrell, Feltham (GB)

(73) Assignee: TYCO FIRE & SECURITY GMBH, Neuhausen am Rheinfall (CH)

( * ) Notice: Subject to any disclaimer, the term of this patent is extended or adjusted under 35 U.S.C. 154(b) by 0 days.

(21) Appl. No.: 16/979,622

(22) PCT Filed: Mar. 15, 2019

(86) PCT No.: PCT/EP2019/056625
§ 371 (c)(1),
(2) Date: Sep. 10, 2020

(87) PCT Pub. No.: WO2019/179902
PCT Pub. Date: Sep. 26, 2019

(65) Prior Publication Data
US 2021/0048836 A1    Feb. 18, 2021

(30) Foreign Application Priority Data
Mar. 23, 2018 (GB) ..................................... 1804718

(51) Int. Cl.
*G08B 25/04* (2006.01)
*G05F 1/56* (2006.01)
(Continued)

(52) U.S. Cl.
CPC ............... *G08B 25/04* (2013.01); *G05F 1/56* (2013.01); *G08B 17/00* (2013.01); *H03K 5/24* (2013.01)

(58) Field of Classification Search
None
See application file for complete search history.

(56) References Cited

U.S. PATENT DOCUMENTS 5,105,370 A    4/1992  Shaw et al.
5,491,402 A *  2/1996  Small .................. H04L 12/2803
                                                    323/282

(Continued)

FOREIGN PATENT DOCUMENTS

EP    2 706 518    3/2014
EP    2 899 704    7/2015

OTHER PUBLICATIONS

International Preliminary Report on Patentability, dated Sep. 29, 2020, from International Application No. PCT/EP2019/056625, filed on Mar. 15, 2019. 6 pages.

(Continued)

*Primary Examiner* — Thomas J. Hiltunen
(74) *Attorney, Agent, or Firm* — ArentFox Schiff LLP

(57) ABSTRACT

The circuit is of a loop-mountable unit of a fire alarm system, and includes: an adjustable current source, arranged to adjust the current from the loop through the power control circuit based on a control signal; an inverting amplifier, arranged to provide the control signal to the adjustable current source in which the control signal is based on the loop voltage; and a damper having an input for connection to a loop and an output connected to the inverting input of the inverting amplifier such that the voltage at the output of the damper is smoothed with respect to the voltage at its input.

15 Claims, 3 Drawing Sheets

(51) Int. Cl.
*G08B 17/00* (2006.01)
*H03K 5/24* (2006.01)

(56) References Cited

U.S. PATENT DOCUMENTS

| | | | | |
|---|---|---|---|---|
| 5,751,210 | A | 5/1998 | Kosich | |
| 6,731,728 | B2 * | 5/2004 | Hollenbach | H04M 19/001 379/93.05 |
| 6,861,827 | B1 * | 3/2005 | Yang | G05F 3/262 323/273 |
| 6,961,665 | B2 * | 11/2005 | Slezak | G01F 23/284 702/143 |
| 8,452,255 | B2 * | 5/2013 | Orth | G01D 21/00 455/343.5 |
| 8,847,565 | B2 * | 9/2014 | Vemula | G05F 1/613 323/271 |
| 8,868,946 | B2 * | 10/2014 | Buhari | G06F 1/266 713/320 |
| 9,374,855 | B2 * | 6/2016 | Siessegger | H05B 45/37 |
| 2002/0082799 | A1 * | 6/2002 | Pramanik | G01D 3/02 702/130 |
| 2002/0097031 | A1 * | 7/2002 | Cook | G05B 19/0423 323/273 |
| 2005/0057234 | A1 * | 3/2005 | Yang | G05F 3/262 323/273 |
| 2009/0167260 | A1 | 7/2009 | Pauritsch et al. | |

OTHER PUBLICATIONS

International Search Report dated May 24, 2019, from International Application No. PCT/EP2019/056625, filed on Mar. 15, 2019. 3 pages.
Written Opinion, dated May 9, 2019, from International Application No. PCT/EP2019/056625, filed on Mar. 15, 2019. 5 pages.
Search Report dated Sep. 19, 2018 for GB1804718.3 filed Mar. 23, 2018. 1 page.

\* cited by examiner

POWER CONTROL CIRCUIT

RELATED APPLICATIONS

This application is a § 371 National Phase Application of International Application No. PCT/EP2019/056625, filed on Mar. 15, 2019, now International Publication No. WO 2019/179902, published on Sep. 26, 2019, which International Application claims priority to United Kingdom Application GB 1804718.3, filed on Mar. 23, 2018, both of which are incorporated herein by reference in their entirety.

The present invention relates to a power control circuit of a loop mountable unit of a fire alarm system.

Fire alarm systems are normally made up of a control panel (often called control and indicating equipment, CIE), one or more addressable communication loops extending from the control panel around a building and a number of loop mountable units, such as fire detectors, call points, sounders and visual alarm devices (VAD).

By being addressable, each communication loop permits commands and data to be passed in packets using unique identifiers for each loop mountable unit between the control panel and the loop mountable units without needing to use hardware switches to route data packets along dedicated paths. Each loop also supplies power to the loop mountable units so that the units do not need additional hardware by which they source their own power. However, the amount of power available to the units is limited by the capacity of a driver within the control panel, and by the resistance of a potentially long run of cable forming the loops. This tends to result in significant voltage drops in the parts of the loops furthest from the control panel. While there are ways to reduce the effect of the voltage drops, each of them introduce their own limitations:

1. Thicker electrical conductors can be used within the cable forming the loop to minimise resistance. However, this adds cost by virtue of an increase in the amount of copper required, and is more difficult to install around bends and fitting onto conduit trays because the cables are bigger and stiffer.
2. The drive voltage at the control panel can be increased, but this introduces dangers associated with those higher voltages. It is much preferred to remain within the regulations that exist for low voltage systems.
3. Shorter loops can be used, but installation is expensive as larger panels which can handle more loops, or repeaters, must be used.

Each loop has a pair of wires, and each end of the loop terminates at the control panel. On addressable communication loops, the communication data between the control panel and the units is encoded in the form of modulated current pulses, the magnitude of which is much smaller than the current consumption of the units on the addressable loop. As a result, instability of current draw from loop units can result in corrupted data packets sent between the panel and the loop devices.

The loop mountable units have been adapted to operate over a large range of input voltages to cater for the variability of voltage drops around the loop. The units themselves require a fixed power to operate. Typically, linear regulators are used to provide the required voltage, and the excess power is simply dissipated as heat. This works well when used on addressable loops since the current draw of linear voltage regulators changes very little over their input voltage range in operation. Hence, the data packets will not be corrupted. However, when the loop voltage is high, a significant amount of power is wasted through heat dissipation, and this puts constraints on the length of the loop and the number of units that can be mounted on it. If the loop were not an addressable communication loop, switching converters could be directly used within the units to fully utilise the available voltage into usable power and reduce the current consumption, maintaining the required power for the circuit. However, switching converters create a lot of electronic signal noise whilst they switch and draw significant gulps of current, and this noise, as well as the capacitance needed to hold the input to the converter when the gulps taken, will corrupt the data on the addressable loop. This causes incompatibility between the supply of power to the units and the addressable communication between the control panel and the units. On one known addressable loop, it takes only 5 mA of current noise to corrupt the loop data. The gulp current from the converter of higher powered units such as beacons is likely to be significantly greater than 50 mA. While capacitance can be used to reduce the switching noise and gulps of current, a much higher capacitance is required and the specification of addressable loops is exceeded.

Higher powered units such as VAD beacons require a significant amount of power to operate, and it is desirable that more such devices are mounted on an addressable communication loop than is currently possible, without being constrained by voltage drops or corruption of loop data.

According to the present invention, a power control circuit of a loop-mountable unit of a fire alarm system, comprises: an adjustable current source, arranged to adjust the current from the loop through the power control circuit based on a control signal; an inverting amplifier, arranged to provide the control signal to the adjustable current source in which the control signal is based on the loop voltage; and a damper having an input for connection to a loop and an output connected to the inverting input of the inverting amplifier such that the voltage at the output of the damper is smoothed with respect to the voltage at its input.

The present invention permits control of the current without corrupting the loop data, also achieving a reduction in the waste of voltage of the device. It is able to operate over a wide input voltage range, present very little capacitance, create little switching noise to the loop, and tolerate rapidly varying voltage levels.

Preferably, the inverting amplifier is arranged to provide the control signal with a voltage which is inversely proportional to the voltage at its inverting input. This permits the adjustable current source to control the current inversely proportionally to the loop voltage, thereby approximating a constant power supply to the loop mountable unit.

In one embodiment, the damper includes a voltage divider and a capacitor. This permits smoothing at a low cost in a simple electronic arrangement.

Preferably, the adjustable current source is an analogue current source which increases and decreases the current from the loop through the power control circuit in proportion to the voltage of the control signal. Importantly, this minimises circuit noise, reducing the likelihood of data corruption. In one arrangement, the adjustable current source includes an operational amplifier which receives the power control signal and a transistor which adjusts the current.

In one embodiment, the power control circuit further comprises a reservoir capacitor arranged to be charged by the adjustable current source. In that embodiment, it is advantageous to include a DC-DC switcher, arranged to intermittently discharge the reservoir capacitor when the voltage of the reservoir capacitor is above a threshold. A voltage dropper circuit may be used to define the reservoir capacitor threshold. Control of the running of the DC-DC switcher may be by a comparator circuit. These components are all effective in controlling the DC-DC switcher so that it does not discharge the reservoir capacitor when it is below the reservoir capacitor threshold.

In the embodiment, an output capacitor is included for supplying power to a VAD unit, the DC-DC switcher being arranged to discharge the reservoir capacitor to charge the output capacitor.

Preferably, a load dump is included to prevent the reservoir capacitor from being over-charged.

An embodiment of the present invention is described below by way of example with reference to the following drawings.

Figure 1:
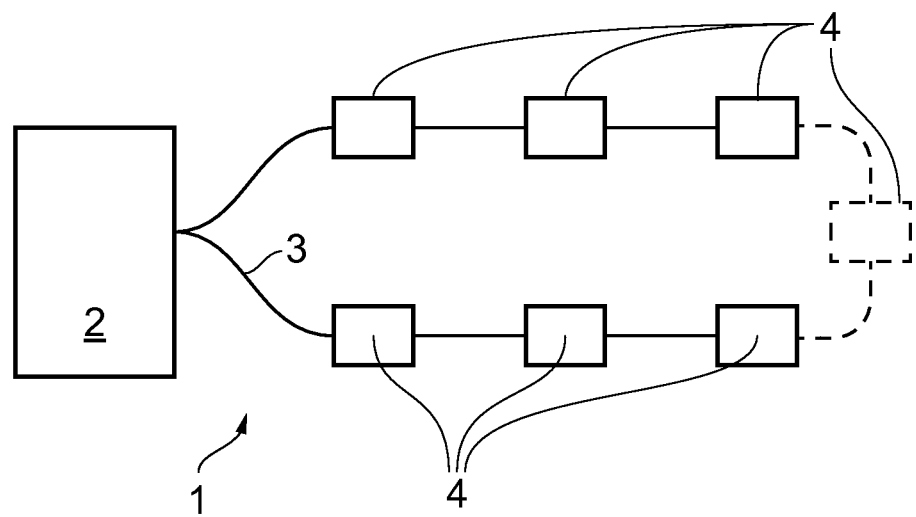
FIG. 1 is a block diagram of a fire alarm system.

FIG. 1 shows a fire alarm system 1 comprising a control panel 2, an addressable communication loop 3, and a number of loop mountable units 4. The control panel 2 would normally have multiple addressable communication loops extending from it, each loop extending to parts of a building or other premises, but a single loop is shown here for simplicity. The ends of the loops are connected together at the control panel, and each loop comprises a pair of wires which the control panel 2 maintains with an operational voltage difference between them. The communication loop 3 is addressable in that it permits commands and data to be passed in packets between the control panel and the loop mountable units 4. Each loop mountable unit 4 has a unique identifier which permits the control panel 2 to send addressed packets to individual loop mountable units 4. The loop mountable units 4 are connected across the pair of wires in the addressable communication loop 3. Communication data passing between the control panel 1 and the units 4 is encoded in the form of modulated current pulses, the magnitude of which is much smaller than the current consumption of the devices on the addressable loop 3.

The operational voltage applied across the wires of the addressable communication loop 3 is supplied to the loop mountable units 4 so as to supply power to the units 4 to avoid the need for additional hardware by which they source their own power. The loop mountable units 4 can be any one of a number of different units of a fire detection system, such as fire detectors, call points, sounders and visual alarm devices (VAD).

Figure 2:
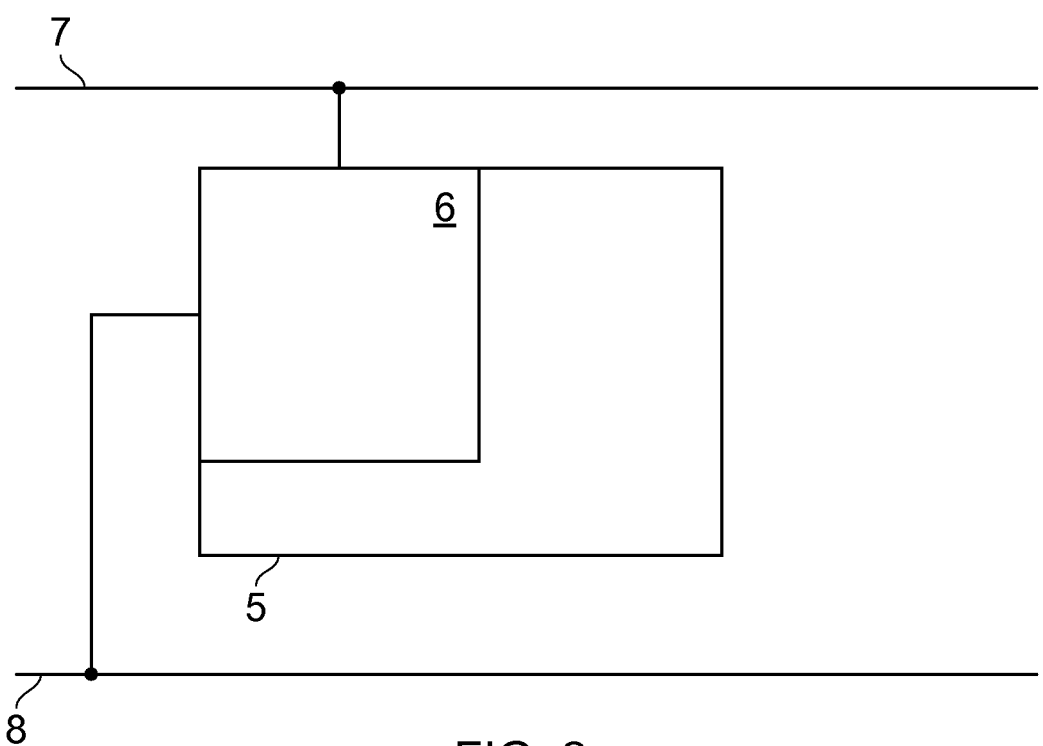
FIG. 2 is a block diagram of a loop mountable unit in the form of a VAD mounted on an addressable communication loop.

FIG. 2 shows a loop mountable unit in the form of a VAD unit 5 having a power control circuit 6. The power control circuit 6 is connected to the addressable communication loop 3 shown as its two constituent wires 7 and 8, between which the operational voltage is maintained by the control panel 2. Not only is power supplied to the VAD unit 5 by the wires 7 and 8, but any control signals, commands and other data is transmitted along the wires as well by current modulation.

Figure 3:
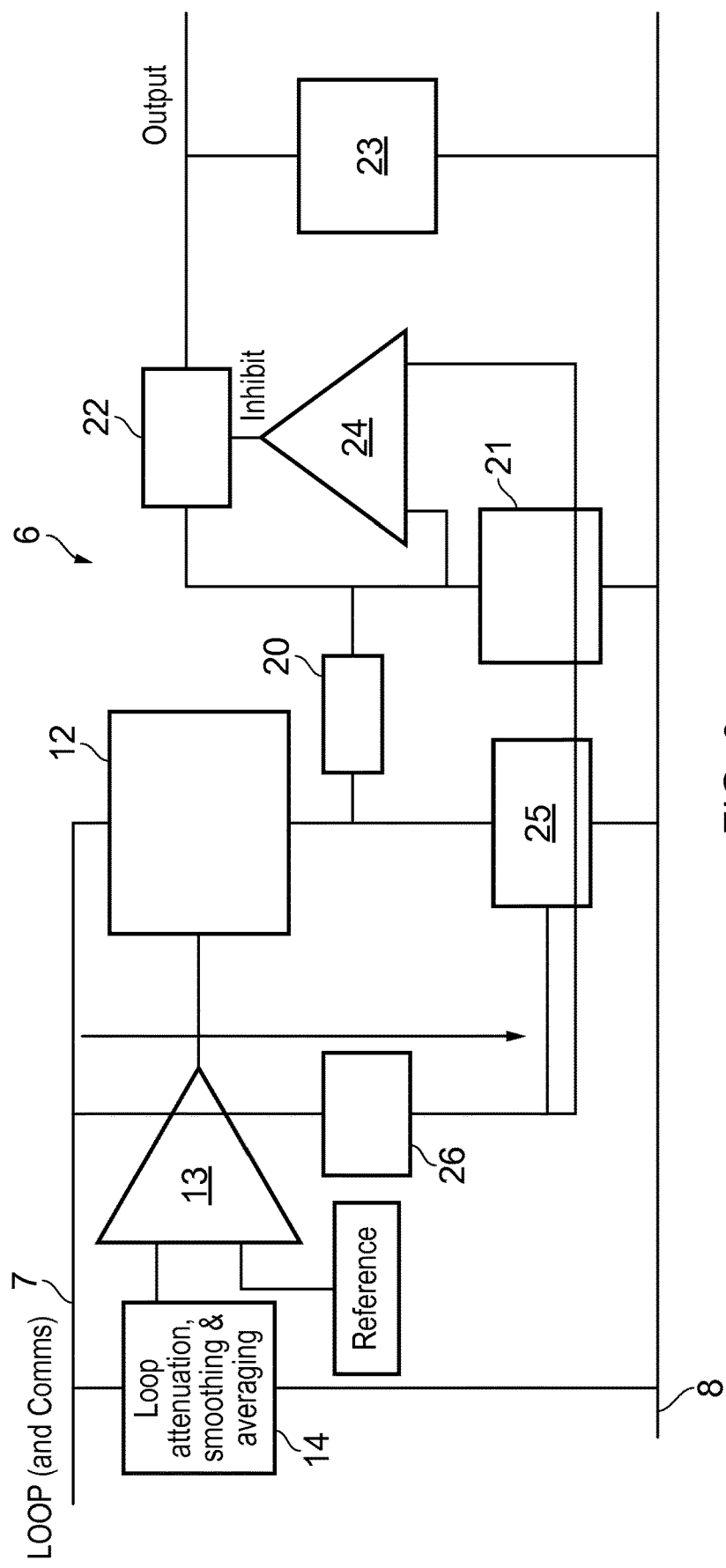
FIG. 3 is a block diagram of a power control circuit of a loop mountable unit of a fire alarm system according to the present invention.

FIG. 3 shows the power control circuit 6 in block diagram form. There are a number of parts to the power control circuit 6: a feed forward controlled adjustable constant current source; a load dump; a reservoir capacitor; an output capacitor; and a DC-DC switcher control. The feed forward controlled adjustable constant current source operates on a real-time basis, charging a reservoir capacitor which in turn feeds a specially controlled DC-DC switcher. This ensures minimal capacitance and switching noise is presented to the loop owing to the constant current source while also allowing a standard DC-DC switcher to operate effectively from a restricted power source by virtue of the control mechanism.

Feed Forward Controlled Adjustable Constant Current Source:

This part of the circuit is made up of three parts:
1. an adjustable current source 12;
2. an inverting amplifier 13; and
3. a damper 14.

The inverting amplifier 13 receives a reference voltage to its non-inverting input and the loop voltage to its inverting input via the damper 14. In general, when the loop voltage is high, the output voltage of the inverting amplifier 13 is relatively low, and when the loop voltage drops, the output voltage of the inverting amplifier 13 increases. The damper 14 attenuates, smooths and averages the loop voltage, preventing the inverting amplifier 13 from responding to rapid changes in the loop voltage. The reference voltage with respect to the positive wire 7 of the loop 3 the virtual earth of the inverting amplifier is set to the midpoint between the attenuated upper and lower voltage limits. From FIG. 4, it can be seen that the damper 14 is constituted by a voltage divider in combination with a capacitor located between the positive wire 7 of the loop and a point between the 2 resistors of the voltage divider.

Figure 4:
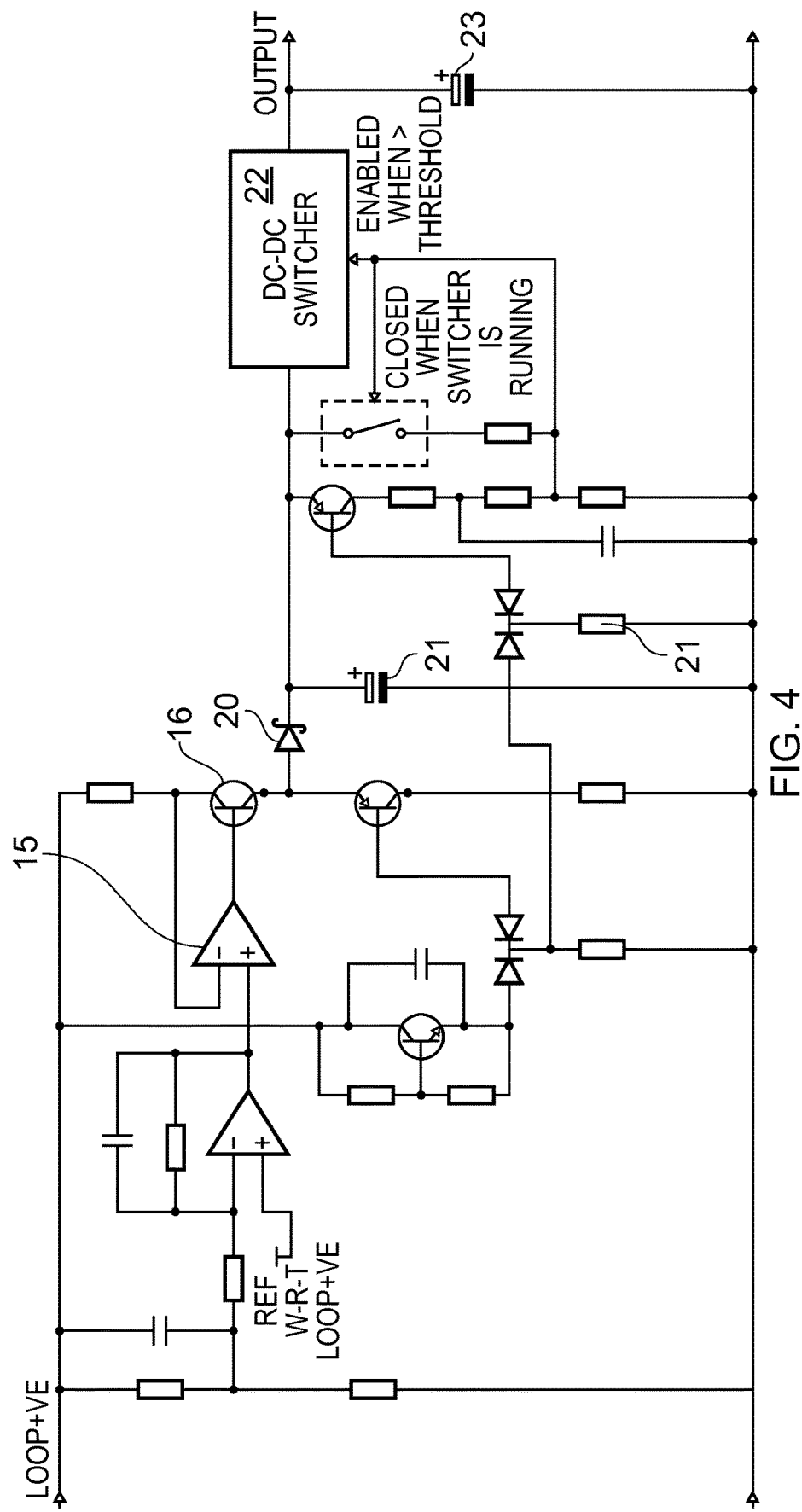
FIG. 4 is a circuit diagram of the power control circuit of the embodiment of FIG. 3.

Also from FIG. 4, it will be seen that the inverting amplifier includes a feedback loop which is arranged such that the output signal from the inverting amplifier operates in the correct range to act as a control signal to the adjustable current source 12.

The adjustable current source 12 is connected to the positive wire 7 of the loop 3, and it permits more current to pass the higher the control signal from the inverting amplifier 13. The adjustable current source is constituted by an operational amplifier 15 and a transistor 16. As the voltage of the control signal from the inverting amplifier 13 increases, the operational amplifier 15 increases its output voltage to the transistor 16 to allow more current to pass. As the voltage of the control signal decreases, the operational amplifier 15 decreases its output voltage to the transistor to reduce the flow of current through the transistor 16.

As explained above, the voltage of the loop varies depending on distance from the ends of the loop, as well as on the current being drawn by the units 4 on the loop 3. Since the VAD unit 5 is a constant power device, when the voltage on the loop is low, action is required to ensure that the current is not too low for the unit to operate correctly. When the voltage on the loop is high, action is required to ensure that the current is not so high that excess power is dissipated through heat. Here, the inverting amplifier 13 controls the adjustable current source 12 by supplying a control signal which is inversely proportional to the voltage on the loop at the position of the unit 5 to maintain a relatively constant, stable power to the unit. Since the voltage supplied to the inverting input of the inverting amplifier 13 is damped, and the amplifier 13 is an analogue electronic device, the control signal is smooth and damped so that, as it changes the current that is permitted to pass through the current source 13, the changes are made in a smooth way so as to avoid generating high levels of current noise which might corrupt the data being communicated through the loop 3. At the same time, power wastage through heat dissipation is minimised by the ability of the adjustable current source 12 to reduce current when the voltage is high. Furthermore, capacitance is kept to a minimum.

This invention is particularly valuable for higher powered devices such as VAD beacons, particularly as it is desirable to mount more such devices on an addressable loop.

Load Dump, DC-DC Switcher, Reservoir Capacitor & Output Capacitor:

The current flowing through the current source 12 is primarily intended to pass through a diode 20 to charge a reservoir capacitor 21. The charge within the reservoir capacitor 21 is directed by a DC-DC switcher 22 to charge up an output capacitor 23, which powers the VAD beacon. The DC-DC switcher 22 is controlled by a voltage from a comparator 24.

It is necessary to ensure that the current source 12 is always in its active region, and thus acting as a current source. A load dump 25 is connected between the current source 12 and the negative wire 8 to provide a path for the current when it is unable to flow into either the reservoir capacitor 21 or the DC-DC switcher 22.

Once the reservoir capacitor 21 is fully charged, current is directed to the load dump 25 and is dissipated by heat. The threshold for the load dump 25 is set by a voltage drop circuit 26 which is fed from the positive loop wire 7. This allows it to automatically adjust to the voltage on the loop at that point. The aim is to charge the reservoir capacitor 21 to as high a voltage as is practicable, minimising unnecessary load dumping.

The DC-DC switcher 22 is fed with power from the reservoir capacitor 21. Since there is insufficient power from the current source 12, it cannot continuously conduct power to the output capacitor 23 without significantly increasing the losses in the current source 12. To overcome this problem, the switcher 22 is periodically inhibited so as to allow the reservoir capacitor 21 to recharge before the switcher 22 runs again. The inhibition signal controlling the DC-DC switcher 22 comes from the comparator 24 which compares the voltage of the reservoir comparator 21 with the voltage of the voltage dropper 26. This gives a control mechanism where, with some hysteresis, the voltage of the reservoir capacitor 21 is maintained slightly below the prevailing minimum loop voltage.

A DC-DC switcher is a standard form of switched mode power supply. In this embodiment, it is a device the running of which can be inhibited.

Referring to FIG. 4, it will be seen that the diode 20 is a Schottky diode, and that the comparator 24 is constituted by a transistor, a number of resistors diodes and an electronic switch. The voltage dropper 26 is constituted by a transistor, a capacitor and resistors.

In operation, current from the current source 12 is generally directed through the diode 20 to charge the reservoir capacitor 21. The reservoir capacitor 21 is used to charge the output capacitor 23 when the DC-DC switcher 22 is running. When the reservoir capacitor 21 is insufficiently charged, the comparator 24 identifies this by its comparison of the voltage of the reservoir capacitor 21 with the voltage of the voltage dropper circuit 26, and generates an inhibit control signal to the DC-DC switcher 22 to stop that switcher. This inhibits the flow of charge from the reservoir capacitor 21 to the output capacitor 23 until the reservoir capacitor 21 is sufficiently charged.

It is important to understand that this part of the circuit operates in a much more satisfactory way in conjunction with the stable current supplied by the current source 12. In particular, much less current is dumped than in known arrangements, while the operation of the power control circuit does not add a significant amount of noise to the communication loop 3 which could compromise its use communicating packets of data.

The invention claimed is:

1. A power control circuit of a loop-mountable unit of a fire alarm system, comprising:
    an adjustable current source, arranged to adjust the current from the loop through the power control circuit based on a control signal;
    an inverting amplifier, arranged to provide the control signal to the adjustable current source to control the adjustable current source to approximate a constant power supply, in which the control signal is based on the loop voltage; and
    a damper having an input for connection to a loop and an output connected to the inverting input of the inverting amplifier such that the voltage at the output of the damper is smoothed with respect to the voltage at its input.

2. The power control circuit according to claim 1, wherein the inverting amplifier is arranged to provide the control signal with a voltage which is inversely proportional to the voltage at its inverting input.

3. The power control circuit according to claim 1, wherein the damper includes a voltage divider and a capacitor.

4. The power control circuit according to claim 1, wherein the adjustable current source is an analogue current source which increases and decreases the current from the loop through the power control circuit in proportion to the voltage of the control signal.

5. The power control circuit according to claim 4, wherein the adjustable current source includes an operational amplifier which receives the power control signal and a transistor which adjusts the current.

6. A power control circuit of a loop-mountable unit of a fire alarm system, comprising:
    an adjustable current source, arranged to adjust the current from the loop through the power control circuit based on a control signal;
    an inverting amplifier, arranged to provide the control signal to the adjustable current source in which the control signal is based on the loop voltage; and
    a damper having an input for connection to a loop and an output connected to the inverting input of the inverting amplifier such that the voltage at the output of the damper is smoothed with respect to the voltage at its input; and
    a reservoir capacitor arranged to be charged by the adjustable current source.

7. The power control circuit according to claim 6, further comprising a DC-DC switcher, arranged to intermittently discharge the reservoir capacitor when a voltage of the reservoir capacitor is above a threshold.

8. The power control circuit according to claim 7, further comprising a voltage dropper circuit which defines the reservoir capacitor threshold.

9. The power control circuit according to claim 7, wherein the running of the DC-DC switcher is controlled by a comparator circuit.

10. The power control circuit according to claim 7, further comprising an output capacitor for supplying power to a VAD unit, the DC-DC switcher being arranged to discharge the reservoir capacitor to charge the output capacitor.

11. The power control circuit according to claim 7, further comprising a load dump to prevent the reservoir capacitor from being over-charged.

12. A power control method of a loop-mountable unit of a fire alarm system, comprising:
- an adjustable current source adjusting the current from the loop through the power control circuit based on a control signal;
- an inverting amplifier providing the control signal to the adjustable current source to control the adjustable current source to approximate a constant power supply, in which the control signal is based on the loop voltage; and
- a damper having an input for connection to a loop and an output connected to the inverting input of the inverting amplifier smoothing the voltage at the output of the damper with respect to the voltage at its input.

13. The method according to claim 12, further comprising the inverting amplifier providing the control signal with a voltage which is inversely proportional to the voltage at its inverting input.

14. The power control circuit according to claim 12, further comprising the adjustable current source increasing and decreasing the current from the loop through the power control circuit in proportion to the voltage of the control signal.

15. A loop-mountable unit of a fire alarm system, comprising:
- a power control circuit for connection to a loop of a fire alarm system, including:
  - an adjustable current source adjusting a current from a loop based on a control signal;
  - an inverting amplifier providing the control signal to the adjustable current source to control the adjustable current source to approximate a constant power supply, in which the control signal is based on the loop voltage of the loop; and
  - a damper connected between the loop and an inverting input of the inverting amplifier for smoothing a voltage provided to the inverting amplifier.

* * * * *